US008192068B2

(12) United States Patent
Kwon et al.

(10) Patent No.: US 8,192,068 B2
(45) Date of Patent: Jun. 5, 2012

(54) LIGHT-EMITTING MODULE

(75) Inventors: You-Jin Kwon, Ansan-si (KR); Won-Il Kim, Ansan-si (KR); Hyun-Gu Kang, Ansan-si (KR); Seung-Ryeol Ryu, Ansan-si (KR); Sang-Geun Bae, Ansan-si (KR); Seung-Sik Hong, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 229 days.

(21) Appl. No.: 12/703,279

(22) Filed: Feb. 10, 2010

(65) Prior Publication Data
US 2010/0328961 A1 Dec. 30, 2010

(51) Int. Cl.
*H01R 33/00* (2006.01)
*F21V 19/04* (2006.01)
(52) U.S. Cl. ......................... 362/646; 362/640; 362/382
(58) Field of Classification Search ................... 362/640, 362/646, 652, 655, 656, 657, 658, 659, 382; 439/56, 278, 279, 280, 281, 282; 257/99, 257/100, E33.056, E33.057, E33.058; 361/760, 361/772, 773, 774, 775, 776, 783
See application file for complete search history.

(56) References Cited

U.S. PATENT DOCUMENTS

| 4,547,840 | A | * | 10/1985 | Tinder | 362/646 |
| 6,582,100 | B1 | * | 6/2003 | Hochstein et al. | 362/294 |
| 7,137,852 | B2 | * | 11/2006 | Tsukamoto | 439/698 |
| 7,766,661 | B2 | * | 8/2010 | Kuwahara et al. | 439/56 |
| 7,972,037 | B2 | * | 7/2011 | Anderson | 362/294 |
| 2005/0194607 | A1 | * | 9/2005 | Barnett et al. | 257/99 |
| 2006/0082315 | A1 | * | 4/2006 | Chan | 315/46 |
| 2009/0073701 | A1 | * | 3/2009 | Lo | 362/373 |

* cited by examiner

*Primary Examiner* — David Crowe
(74) *Attorney, Agent, or Firm* — H.C. Park & Associates, PLC

(57) ABSTRACT

A light-emitting module includes a printed circuit board (PCB), a fastening member, and a light-emitting package. The PCB has a power-supplying pad to provide electrical power. The fastening member is disposed on the PCB and has a package-receiving hole exposing the power-supplying pad. The light-emitting package is received by the package-receiving hole such that the light-emitting package is electrically connected to the power-supplying pad and detachably coupled with the fastening member. Therefore, the light-emitting package may be easily combined with the PCB, and the light-emitting package may be replaced when desired.

9 Claims, 4 Drawing Sheets

LIGHT-EMITTING MODULE

CROSS REFERENCE TO RELATED APPLICATION

This application claims priority from and the benefit of Korean Patent Application No. 2009-58584, filed on Jun. 29, 2009, which is hereby incorporated by reference for all purposes as if fully set forth herein.

BACKGROUND OF THE INVENTION

1. Field of the Invention

Exemplary embodiments of the present invention relate to a light-emitting module. More particularly, exemplary embodiments of the present invention relate to a light-emitting module capable of being a general lighting apparatus or a backlight for a liquid crystal display apparatus.

2. Discussion of the Background

In general, a light-emitting module includes a plurality of light-emitting packages and a plurality of printed circuit boards (PCBs). Each of the light-emitting packages includes a light-emitting chip having a light emitting diode and a housing to receive the light-emitting chip. The PCB includes a power-supplying pad to transfer external electrical power. The light-emitting package receives electrical power through a lead frame that is electrically connected to the power-supplying pad. Typically, the lead frame of the light-emitting package is soldered to the power-supplying pad of the PCB.

When one of the light-emitting packages is faulty, it should be replaced. However, it may be complicated to replace a light-emitting package because the typical process includes de-soldering the lead frame from the power-supplying pad. As a result, the entire light-emitting module having a faulty light-emitting package is often replaced.

SUMMARY OF THE INVENTION

Exemplary embodiments of the present invention provide a light-emitting module having a light-emitting package that may be easily combined with and also easily detached from a printed circuit board so that the light-emitting package may be replaced as desired, for example, when the light-emitting package fails.

Exemplary embodiments of the present invention also provide a light-emitting module that includes a printed circuit board (PCB), a fastening member, and a light-emitting package. The PCB has a power-supplying pad to provide electrical power. The fastening member is disposed on the PCB and has a package-receiving hole exposing the power-supplying pad. The light-emitting package is received by the package-receiving hole such that the light-emitting package is electrically connected to the power-supplying pad and is detachably coupled with the fastening member. The fastening member may include an elastic material to detachably fasten the light-emitting package.

The light-emitting package may include a light-emitting chip, a housing, and a lead frame. The light-emitting chip generates light. The housing receives the light-emitting chip. The lead frame extends from inside the housing to outside the housing to electrically connect the light-emitting chip to the power-supplying pad. A portion of the lead frame may be curved to provide elasticity to the lead frame where the lead frame contacts the power-supplying pad.

The housing may include a fastening protrusion formed on an outer surface of the housing, and the fastening member may include a catching jaw corresponding to the fastening protrusion. The catching jaw is formed on an inner surface of the fastening member. The inner surface of the fastening member contacts the outer surface of the housing, and the catching jaw receives the fastening protrusion to fasten the light-emitting package to the PCB.

The housing may have a hollow portion formed on an outer surface of the housing. The fastening member may have a penetration hole corresponding to the hollow portion and an insertion unit penetrating the penetration hole and inserted into the hollow portion of the housing to fasten the light-emitting package to the PCB.

Exemplary embodiments of the present invention disclose a light-emitting module having a light-emitting package, a printed circuit board (PCB) comprising a power-supplying pad to provide power, and a fastening member disposed on the PCB. The fastening member comprises a package-receiving hole exposing the power-supplying pad and receiving the light-emitting package. The light-emitting package is electrically connected to the power-supplying pad and detachably couples with the fastening member when received by the package-receiving hole.

Exemplary embodiments of the present invention also disclose a light-emitting module having a printed circuit board (PCB) comprising a power-supplying pad to provide power and a fastening member comprising a first fastening part and a second fastening part disposed on the PCB. The power-supplying pad is disposed between the first fastening part and the second fastening part, and a light-emitting package is detachably inserted into a space formed by the first fastening part and the second fastening part so that the light-emitting package is electrically connected to the power-supplying pad inside the space.

Exemplary embodiments of the present invention further disclose a process of making a light-emitting module that comprises forming a fastening member on a printed circuit board (PCB), wherein the PCB comprises a power-supplying pad to provide power, and the fastening member comprises a package-receiving hole for receiving a light-emitting package; and inserting the light-emitting package into the package-receiving hole, wherein the light-emitting package is electrically connected to the power-supplying pad and is detachably coupled to the fastening member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute part of this specification, illustrate exemplary embodiments of the invention, and together with the description serve to explain the principles of the invention.

DETAILED DESCRIPTION OF THE ILLUSTRATED EMBODIMENTS

Figure 1:
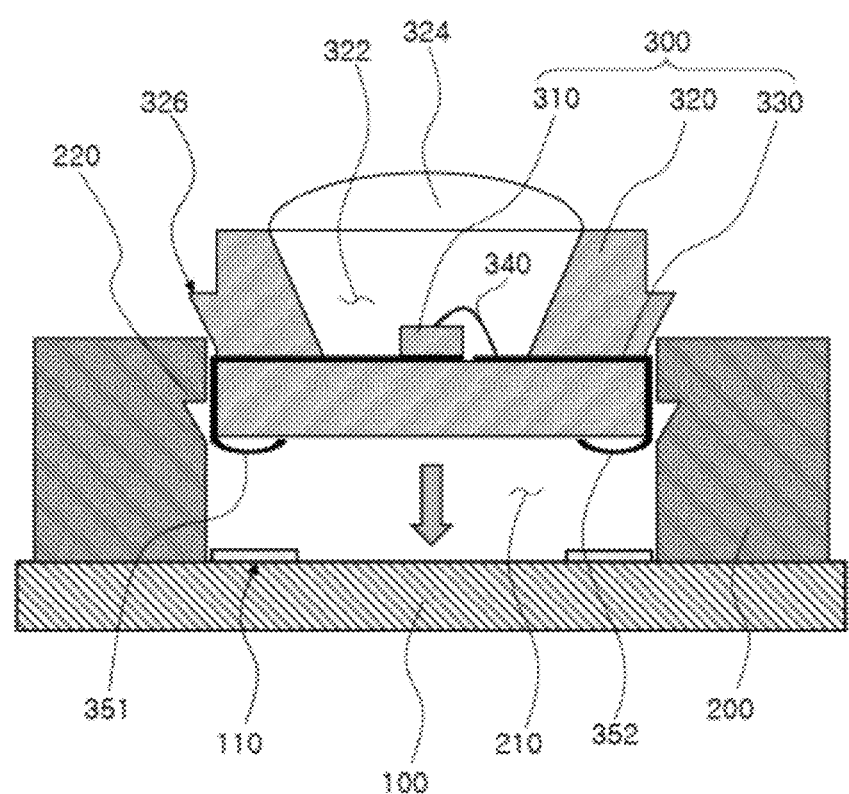
FIG. 1 is a cross-sectional view of a light-emitting module according to an exemplary embodiment of the present invention before a light emitting-chip is fastened to a printed circuit board.

The invention is described more fully hereinafter with reference to the accompanying drawings, in which exemplary embodiments of the invention are shown. This invention, however, may be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that, although terms such as first, second, and third may be used to describe various items such as elements, components, regions, layers, or sections, these items are not be limited by these terms. These terms are only used to distinguish one item from another item. Thus, a first element, component, region, layer, or section could be termed a second element, component, region, layer, or section without departing from the teachings of the present invention.

Spatially relative terms such as "beneath," "below," "lower," "above," and "upper" may be used for ease of description to describe how an element or feature is related to another element or feature as illustrated in the figures. It will be understood that spatially relative terms are intended to encompass different orientations of the device in use or in operation in addition to the orientation depicted in the figures. For example, if a device shown in a figure is rotated, elements described as "below" or "beneath" other elements or features might then be oriented "above" the other elements or features. Thus, the exemplary term "below" encompasses both orientations of "above" and "below." The device may be otherwise oriented (rotated 90 degrees or at other orientations), and the spatially relative descriptors used herein interpreted accordingly.

Hereinafter, exemplary embodiments of the present invention are described in detail with reference to the accompanying drawings.

Figure 2:
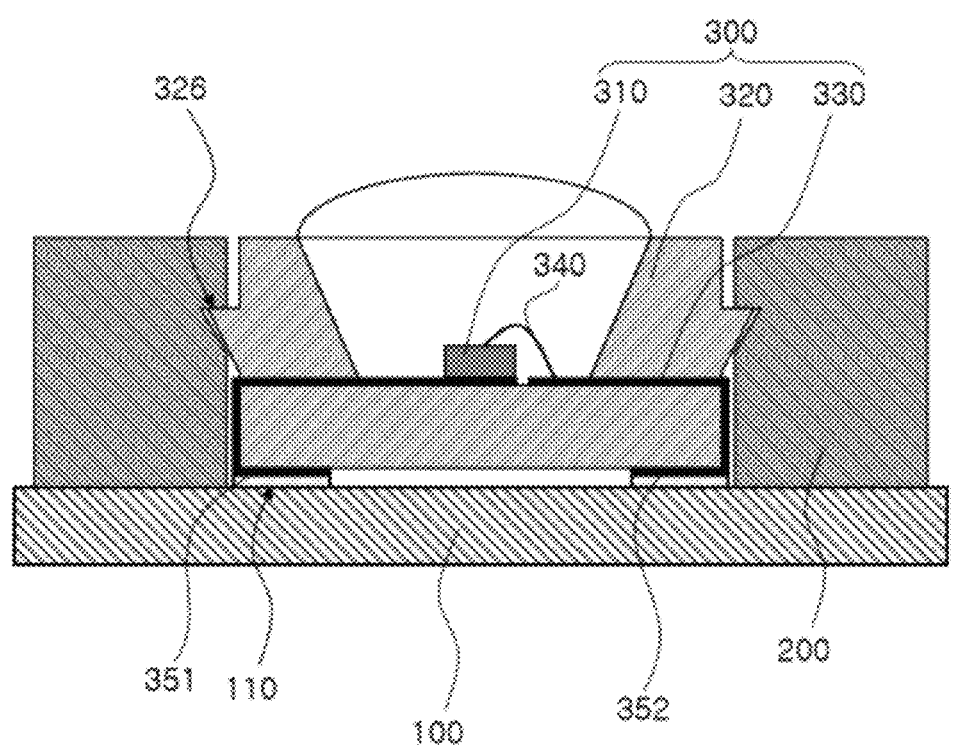
FIG. 2 is a cross-sectional view showing the light-emitting module of FIG. 1 after the light emitting-chip is fastened to the printed circuit board.

FIG. 1 is a cross-sectional view of a light-emitting module according to an exemplary embodiment of the present invention before a light emitting-chip is fastened to a printed circuit board, and FIG. 2 is a cross-sectional view showing the light-emitting module of FIG. 1 after the light emitting-chip is fastened to the printed circuit board.

Referring to FIG. 1 and FIG. 2, a light-emitting module includes a printed circuit board (PCB) 100, a fastening member 200, and a light-emitting package 300. The PCB 100 includes a power-supplying pad 110 to transfer an external driving power to the light-emitting package 300.

The power-supplying pad 110 is formed on the PCB 100 and may have two pads spaced apart from each other to apply opposite polarity voltages to the light-emitting package 300. Additionally, the PCB 100 includes a plurality of wirings (not shown) to transfer the external power to the power-supplying pad 110. The plurality of wirings may be formed on an upper surface of the PCB 100 or a lower surface of the PCB 100.

The fastening member 200 is disposed on the PCB 100 and has a package-receiving hole 210 exposing the power-supplying pad 110. The fastening member 200 may include an elastic material to detachably fasten the light-emitting package 300. For example, the fastening member 200 may include elastic materials such as rubber, silicone, or compositions thereof. However, the fastening member 200 may include relatively hard materials such as a plastic. The fastening member 200 may be disposed on the PCB 100 such that the fastening member 200 is detachably combined with the PCB 100. Alternatively, the fastening member 200 may be integrally formed with the PCB 100.

When the PCB 100 includes the wirings formed thereon, the fastening member 200 may make contact with the wirings. Therefore, electrically insulating material may be disposed between the fastening member 200 and the wirings. The fastening member 200 may have a rectangular shape as shown in FIG. 1 and FIG. 2. Alternatively, the fastening member 200 may have other polygonal shapes. The fastening member 200 may have a catching jaw 220 formed on an inner surface of the fastening member 200. Preferably, two catching jaws 220 may be formed to face each other.

The light-emitting package 300 is received by (or inserted into) the package-receiving hole 210 to combine with the fastening member 200 and electrically connect to the power-supplying pad 110 on the PCB 100. The light-emitting package 300 is detachably coupled with the fastening member 200. In other words, the light-emitting package 300 may be easily detached from the fastening member 200 so that the light-emitting package 300 may be easily replaced as desired.

Since the fastening member 200 may include elastic material, a user may compress the peripheral regions of the fastening member 200 to increase the width of the package-receiving hole 210 so that the light-emitting package 300 may be easily extracted from the package-receiving hole 210.

The light-emitting package 300 includes a light-emitting chip 310, a housing 320, and a lead frame 330. The light-emitting chip 310 includes a semiconductor material, for example, gallium nitride or indium nitride. The light-emitting chip 310 may generate light of various wavelengths such as red light, green light, blue light, ultraviolet light, or white light.

The housing 320 receives the light-emitting chip 310. The housing 320 may include, for example, polyphthalamide resin and may be formed through a molding method. The housing 320 may include electrically or thermally insulating material.

In exemplary embodiments of the present invention, the housing 320 has an opening portion 322 exposing at least a portion of the light-emitting chip 310. The opening portion 322 may have various shapes such as a circular shape, an oval shape, or polygonal shape.

The inner surface of the housing 320 corresponding to the opening portion 322 may be angled with respect to the PCB 100 increasing the solid angle subtended by light generated by the light-emitting chip 310.

The opening portion 322 may be filled with an encapsulant covering the light-emitting chip 310. The encapsulant may be optically transparent to efficiently transmit light generated by the light-emitting chip 310. Additionally, a lens 324 may be disposed on the housing 320.

The housing 320 include a fastening protrusion 326 formed on an outer surface of the housing 320. The outer surface of the housing faces the inner surface of the fastening member 200. When the light-emitting package 300 is inserted into the package-receiving hole 210, the fastening protrusion 326 is combined with the catching jaw 220 so that the light-emitting package 300 is fastened to the PCB 100 through the fastening member 200. Two fastening protrusions 326 may be formed to correspond to the two catching jaws 220.

The fastening protrusion 326 may have a triangular shape as shown in FIG. 1 and FIG. 2. Alternatively, the fastening protrusion 326 may have various shapes such as a semicircular shape or polygonal shape. In this embodiment, the fastening protrusion 326 has a triangular shape with increasing width along a direction from a lower portion of the housing 320 to the upper portion of the housing 320. For example, the fastening protrusion 326 has a right triangular shape as shown in FIG. 1 and FIG. 2.

As a result, when the light-emitting package 300 is inserted into the package-receiving hole 210, the fastening protrusion 326 is caught by the catching jaw 220 so that the light-emitting package 300 is stably combined with the PCB 100 through the fastening member 200. Furthermore, the width of the fastening protrusion 326 increases along the direction from the lower portion of the housing 320 to the upper portion of the housing 320 so that upper portion of the fastening protrusion 326 is caught by the catching jaw 220 to prevent unwanted detachment of the light-emitting package 300 from the package-receiving hole 210.

The fastening protrusion 326 may be spaced apart from the lead frame 330 to prevent contact between the fastening protrusion 326 and the lead frame 330.

The lead frame 330 is electrically connected to the light-emitting chip 310 by a wire 340, and the lead frame 330 extends from inside the housing 320 to outside the housing 320 to be electrically connected to the power-supplying pad 110. In the present embodiment, the lead frame 330 includes two lead terminals 351 and 352 spaced apart from each other.

In order to electrically connect the light-emitting chip 310 to the lead frame 330, a portion of lead frame 330 on which the light-emitting chip 310 is mounted is exposed through the opening portion 322. Furthermore, the lead frame 330 extends out of the housing 320 to be electrically connected to the power-supplying pad 110 via the lead terminals 351 and 352. Voltages may be applied to the two lead terminals by contact with the power-supplying pads 110.

A portion of the lead frame 330, e.g., the lead terminal 351 and 352, is curved to provide elasticity and to contact with the power-supplying pad 110. When the light-emitting package 300 is inserted into the package-receiving hole 210, the portion of the lead frame 330 that is curved pushes against the power-supplying pad 110 so that the fastening protrusion 326 and the catching jaw 220 become engaged. Furthermore, when the light-emitting package 300 is inserted into the package-receiving hole 210, the portion of the lead frame 330, which is curved, ensures electrical connection between the power-supplying pad 110 and the lead frame 330.

As shown in FIG. 2, when the light-emitting package 300 is inserted into the package-receiving hole 210, the fastening protrusion 326 of the housing 320 may be caught by the catching jaw 220 of the fastening member 200.

Figure 3:
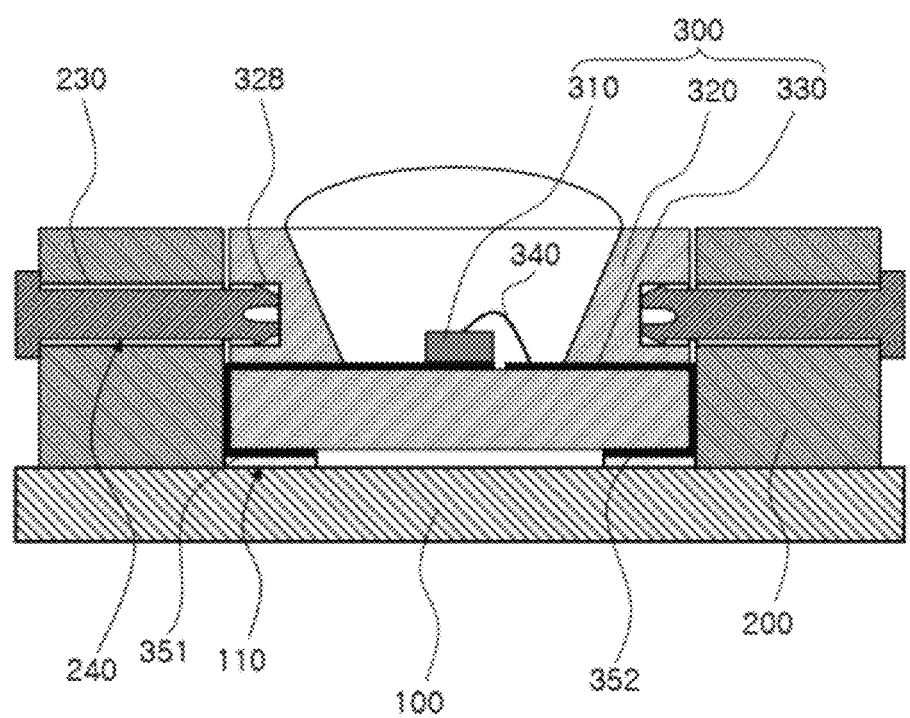
FIG. 3 is a cross-sectional view of a light-emitting module according to another exemplary embodiment of the present invention.

FIG. 3 is a cross-sectional view of a light-emitting module according to another exemplary embodiment of the present invention.

Referring to FIG. 3, the housing 320 includes a hollow portion 328. The housing 320 may include two hollow portions 328. The two hollow portions 328 may be formed at opposite sides of the housing 320. The hollow portion 328 is spaced apart from the lead frame 330 to prevent contact between the hollow portion 328 and the lead frame 330.

The fastening member 200 includes a penetration hole 230. The penetration hole 230 is formed at a region corresponding to the hollow portion 328. The fastening member 200 also includes an insertion unit 240. The insertion unit 240 penetrates the penetration hole 230 to be inserted into the hollow portion 328 to fasten the light-emitting package 300 to the PCB 100.

The insertion unit 240 has a cross-sectional area that is similar to that of the penetration hole 230 to prevent foreign substances from entering the package-receiving hole 210 so that the light-emitting efficiency of the light-emitting package 300 is not diminished. The insertion unit 240 may include an elastic material so that the insertion unit 240 may easily penetrate the penetration hole 238 and easily insert into the hollow portion 328.

A first end portion of the insertion unit 240, which is inserted into the hollow portion 328, may be formed to have a hook-shape as shown in FIG. 3. Therefore, the insertion unit 240 is not easily separated from the hollow portion 328 of the housing 320 to stabilize the connection between the light-emitting package 300 and the PCB 100. A second end portion of the insertion unit 240, which is opposite to the first end portion, has a larger radius than a center portion of the insertion unit 240 so that the insertion unit 240 has a nail head shape. Therefore, the insertion unit 240 may be easily extracted from the hollow portion 328 when detaching the light-emitting package 300 from the PCB 100, for example, when the light-emitting package 300 fails. Although not shown in FIG. 3, a portion of the insertion unit 240 between the first and second end portions may have a larger radius than the end portions so that the insertion unit 240 may be tightly combined with the fastening member 200.

Although not shown in FIG. 3, a first end portion of the insertion unit 240, which is inserted into the hollow portion 328, may be bent, and the hollow portion 328 may have a keyway shape that accommodates rotation of the first end portion of the insertion unit 240 within the hollow portion 328. When the first end portion of the insertion unit 240 is inserted into the hollow portion 328, the insertion unit 240 may be rotated and locked into the hollow portion 328 to securely fasten the light-emitting package 300 to the PCB 100.

Alternatively, the two insertion units 240 may have different shapes relative to each other. For example, one of the two insertion units 240 may have a hook-shaped end portion as described above, and the first end portion of the other insertion unit 240 may have a cross-sectional area similar to that of the hollow portion 328 to prevent the insertion unit 240 from being disengaged from the penetration hole 230 and the hollow portion 328. Therefore, the light-emitting package 300 may be stably combined with the PCB 100.

The fastening member 200 may be integrally formed with the PCB 100. Alternatively, the fastening member 200 may be formed separately from the PCB 100 so that the fastening member 200 may be detachably combined with the PCB 100.

Figure 4:
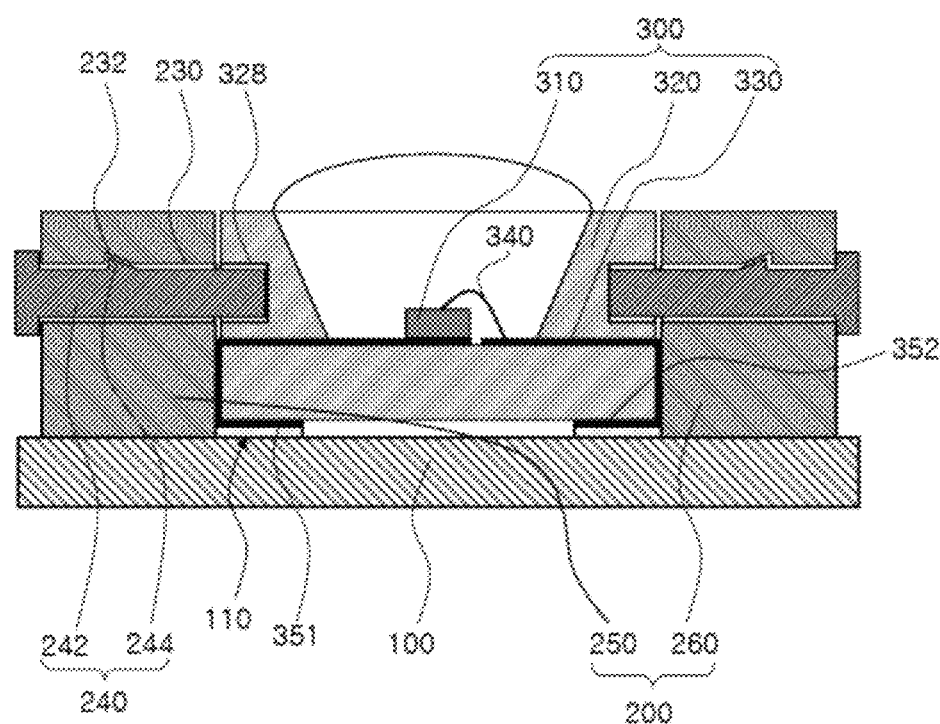
FIG. 4 is a cross-sectional view of a light-emitting module according to another exemplary embodiment of the present invention.

FIG. 4 is a cross-sectional view of a light-emitting module according to another exemplary embodiment of the present invention.

Referring to FIG. 4, a light-emitting module includes a PCB 100, a fastening member 200, and a light-emitting package 300. The PCB 100 has a power-supplying pad 110 to apply electrical power to the light-emitting package 300. The fastening member 200 includes a first fastening part 250 and a second fastening part 260 spaced apart from each other such that the power-supplying pad 110 on the PCB 100 is disposed between the first fastening part 250 and the second fastening part 260.

The first fastening part 250 and the second fastening part 260 are spaced apart on the PCB 100 to define a package-receiving space to receive the light-emitting package 300. The package-receiving space may have various shapes such as a rectangular shape or a semicircular shape.

The first fastening part 250 and the second fastening part 260 may be detachably combined with the PCB 100. Alternatively, the first fastening part 250 and the second fastening part 260 may be integrally formed with the PCB 100.

The light-emitting package 300 is inserted into the package-receiving space between the first fastening part 250 and the second fastening part 260 to be detachably combined with the PCB 100 so that the light-emitting package 300 is electrically connected to the power-supplying pad 110.

The fastening member 200 includes a penetration hole 230 at a position corresponding to the hollow portion 328. The fastening member 200 may further include an insertion unit 240 to pass through the penetration hole 230 and to insert into the hollow portion 328 so that the light-emitting package 300 is fastened to the PCB 100.

The insertion unit 240 includes an insertion body 242 and a protrusion 244. The insertion body 242 penetrates the penetration hole 230 and inserts into the hollow portion 328. The insertion body 242 has a cross-sectional shape similar to that of the penetration hole 230 to prevent foreign substances from entering the package-receiving space.

The protrusion 244 protrudes from the insertion body 242 and inserts into a catching recess 232 formed on an inner surface of the penetration hole 230. More than one catching recess 232 may be formed on the inner surface of the penetration hole 230.

The width of the protrusion 244 decreases along the direction from outside the fastening member 200 to the housing 320. For example, the protrusion 244 has a right triangular cross-section whose hypotenuse forms an acute included angle with the insertion unit 240.

Therefore, when the insertion unit 240 is extracted from the hollow portion 328, the protrusion 244 is caught by the catching recess 232 to prevent the insertion unit 240 from being pulled completely out of the penetration hole 230.

In contrast, when the insertion unit 240 is pulled out of the hollow portion 328 in order to replace the light-emitting package 300, the insertion unit 240 may be pushed and rotated. When the protrusion 244 disengages from the catching recess 232, the insertion unit 240 may be easily pulled out of the penetration hole 230. Then, the light-emitting package 300 may be easily detached from the package-receiving space.

According to exemplary embodiments of the present invention, the light-emitting package 300 is received by the package-receiving hole 210 so that the light-emitting package 300 may be easily combined with the PCB 100. Additionally, the light-emitting package 300 may be replaced when the light-emitting package 300 does not operate as desired.

Furthermore, a portion of the lead frame 330 may be curved to introduce elasticity to the lead frame 330 so that the lead frame 330 may easily electrically contact the power-supplying pad. Therefore, when the light-emitting package 300 is inserted into the package-receiving hole 210, the portion of the lead frame 330, which is curved, pushes against power-supplying pads 110 so that the fastening protrusion 326 and the catching jaw 220 become engaged.

Furthermore, the fastening member 200 includes the insertion unit 240 to penetrate the penetration hole 230 and to insert into the hollow portion 328 so that the light-emitting package 300 may be stably fastened to the PCB 100.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light-emitting module, comprising:
   a light-emitting package;
   a printed circuit board (PCB) comprising a power-supplying pad to provide power; and
   a fastening member disposed on the PCB,
   wherein the fastening member comprises a package-receiving hole exposing the power-supplying pad and receiving the light-emitting package,
   wherein the light-emitting package is electrically connected to the power-supplying pad and detachably coupled with the fastening member,
   wherein the light-emitting package comprises:
   a light-emitting chip to generate light;
   a housing receiving the light-emitting chip; and
   a lead frame,
   wherein the lead frame extends from inside the housing to outside the housing to electrically connect the light-emitting chip to the power-supplying pad,
   wherein the housing comprises a hollow portion formed on an outer surface of the housing, and
   wherein the fastening member comprises a penetration hole corresponding to the hollow portion and an insertion unit penetrating the penetration hole and inserted into the hollow portion to fasten the light-emitting package to the PCB.

2. The light-emitting module of claim 1, wherein a portion of the lead frame is curved where the portion of the lead frame contacts the power-supplying pad.

3. The light-emitting module of claim 1, wherein the fastening member comprises an elastic material.

4. A light-emitting module, comprising:
   a printed circuit board (PCB) comprising a power-supplying pad to provide power;
   a fastening member disposed on the PCB and comprising a first fastening part and a second fastening part, wherein the power-supplying pad is disposed between the first fastening part and the second fastening part; and
   a light-emitting package detachably coupled with the fastening member and electrically connected to the power-supplying pad,
   wherein the light-emitting package comprises:
   a light-emitting chip to generate light;
   a housing receiving the light-emitting chip; and
   a lead frame,
   wherein the lead frame extends from inside the housing to outside the housing to electrically connect the light-emitting chip to the power-supplying pad,
   wherein the housing comprises a hollow portion formed on an outer surface of the housing, and
   wherein the fastening member comprises a penetration hole corresponding to the hollow portion and an insertion unit penetrating the penetration hole and inserted into the hollow portion.

5. The light-emitting module of claim 4, wherein a portion of the lead frame is curved where the portion of the lead frame contacts the power-supplying pad.

6. The light-emitting module of claim 4, wherein the fastening member comprises an elastic material.

7. A process of making a light-emitting module, comprising:
- forming a fastening member on a printed circuit board (PCB), wherein the PCB comprises a power-supplying pad to provide power, and the fastening member comprises a package-receiving hole for receiving a light-emitting package; and
- inserting the light-emitting package into the package-receiving hole, wherein the light-emitting package is electrically connected to the power-supplying pad and is detachably coupled to the fastening member, wherein the light-emitting package comprises:
a light-emitting chip to generate light;
a housing receiving the light-emitting chip; and
a lead frame, wherein the lead frame extends from inside the housing to outside the housing to electrically connect the light-emitting chip to the power-supplying pad, wherein the housing comprises a hollow portion formed on an outer surface of the housing, and wherein the fastening member comprises a penetration hole corresponding to the hollow portion and an insertion unit penetrating the penetration hole and inserted into the hollow portion.

8. The process of claim 7, wherein a portion of the lead frame is curved where the portion of the lead frame contacts the power-supplying pad.

9. The process of claim 7, wherein the fastening member comprises an elastic material.

* * * * *